United States Patent
Sousa et al.

(10) Patent No.: US 11,557,031 B2
(45) Date of Patent: Jan. 17, 2023

(54) INTEGRATED MULTI-TOOL RETICLE INSPECTION

(71) Applicant: KLA Corporation, Milpitas, CA (US)

(72) Inventors: Weston Sousa, San Jose, CA (US); Sterling Watson, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 257 days.

(21) Appl. No.: 17/099,368

(22) Filed: Nov. 16, 2020

(65) Prior Publication Data

US 2021/0158500 A1    May 27, 2021

Related U.S. Application Data

(60) Provisional application No. 62/938,775, filed on Nov. 21, 2019.

(51) Int. Cl.
*G06T 7/00* (2017.01)
*G01N 21/95* (2006.01)
*G01N 21/88* (2006.01)
*G06T 7/70* (2017.01)

(52) U.S. Cl.
CPC ......... *G06T 7/001* (2013.01); *G01N 21/8851* (2013.01); *G01N 21/9501* (2013.01); *G06T 7/0008* (2013.01); *G06T 7/70* (2017.01); *G01N 2021/8887* (2013.01); *G06T 2207/30148* (2013.01)

(58) Field of Classification Search
CPC ......... G06T 7/001; G06T 7/0008; G06T 7/70; G06T 2207/30148; G01N 21/8851; G01N 21/9501; G01N 2021/8887; G01N 2021/95676; G03F 1/84

See application file for complete search history.

(56) References Cited

U.S. PATENT DOCUMENTS

| | | | |
|---|---|---|---|
| 8,711,346 B2 | 4/2014 | Stokowski | |
| 8,785,082 B2 | 7/2014 | Xiong et al. | |
| 8,842,272 B2 | 9/2014 | Wack et al. | |
| 8,916,831 B2 | 12/2014 | Wang | |
| 9,734,422 B2 * | 8/2017 | Kolchin | G06V 10/30 |
| 10,496,781 B2 | 12/2019 | Fang et al. | |

(Continued)

FOREIGN PATENT DOCUMENTS

| | | |
|---|---|---|
| JP | 2013167608 A | 8/2013 |
| KR | 1020100022939 A | 3/2010 |
| WO | 2014164894 A1 | 10/2014 |

OTHER PUBLICATIONS

PCT International Search Report and Written Opinion for International Application No. PCT/US2020/060927 dated Mar. 11, 2021, 7 pages.

*Primary Examiner* — Roy M Punnoose
(74) *Attorney, Agent, or Firm* — Suiter Swantz pc llo

(57) ABSTRACT

A reticle inspection system may include two or more inspection tools to generate two or more sets of inspection images for characterizing a reticle, where the two or more inspection tools include at least one reticle inspection tool providing inspection images of the reticle. The reticle inspection system may further include a controller to correlate data from the two or more sets of inspection images to positions on the reticle, detect one or more defects of interest on the reticle with the correlated data as inputs to a multi-input defect detection model, and output defect data associated with the defects of interest.

45 Claims, 7 Drawing Sheets

(56) References Cited

U.S. PATENT DOCUMENTS

| | | |
|---|---|---|
| 2010/0226562 A1 | 9/2010 | Wu et al. |
| 2016/0140412 A1* | 5/2016 | Kolchin .................. G06T 7/001 382/260 |
| 2017/0249732 A1* | 8/2017 | Shankar ................ G06T 7/0008 |
| 2019/0219929 A1 | 7/2019 | Hauptmann et al. |
| 2020/0096862 A1 | 3/2020 | Tolani et al. |
| 2020/0225574 A1* | 7/2020 | Kvamme ............. G01N 21/956 |

* cited by examiner

INTEGRATED MULTI-TOOL RETICLE INSPECTION

CROSS-REFERENCE TO RELATED APPLICATION

The present application claims the benefit under 35 U.S.C. § 119(e) of U.S. Provisional Application Ser. No. 62/938,775 filed Nov. 21, 2019, naming Weston Sousa and Sterling Watson as inventors, which is incorporated herein by reference in the entirety.

TECHNICAL FIELD

The present disclosure relates generally to reticle inspection and, more particularly, to multi-tool reticle inspection.

BACKGROUND

Demand for semiconductor devices with ever-smaller footprints and features present a wide range of manufacturing challenges beyond fabrication at a desired scale. In the context of semiconductor fabrication, accurately identifying the type and size of defects on a patterned reticle, or pattern mask, for lithographically exposing patterns on one or more sample layers is an important step in improving throughput and yield. As mask features become smaller, the complexity of inspection tools required to inspect for defects becomes increasingly complex and expensive. Additionally, various existing or in-development inspection technologies may fail to provide a desired inspection sensitivity for all defect classes of interest. Therefore, it would be desirable to provide a system and method that cure one or more of the shortfalls of the previous approaches identified above.

SUMMARY

A reticle inspection system is disclosed in accordance with one or more illustrative embodiments of the present disclosure. In one illustrative embodiment, the system includes two or more inspection tools configured to generate two or more sets of inspection images for characterizing a reticle, where the two or more inspection tools inspect a common portion of the reticle, and where the two or more inspection tools include at least one reticle inspection tool providing inspection images of the reticle. In another illustrative embodiment, the system includes a controller communicatively coupled to the two or more inspection tools. In another illustrative embodiment, the controller correlates data from the two or more sets of inspection images to positions on the reticle. In another illustrative embodiment, the controller detects one or more defects of interest on the reticle with the correlated data as inputs to a multi-input defect detection model, where the multi-input defect detection model determines defects for any particular position on the reticle based on analysis of the correlated data associated with the particular position. In another illustrative embodiment, the controller outputs defect data associated with the defects of interest.

A reticle inspection system is disclosed in accordance with one or more illustrative embodiments of the present disclosure. In one illustrative embodiment, the system includes one or more hot reticle inspection tools configured for hot inspection of a reticle. In another illustrative embodiment, the system includes one or more filtering reticle inspection tools configured for defect filtering, where the one or more filtering reticle inspection tools are different than the one or more hot inspection tools. In another illustrative embodiment, the system includes a controller communicatively coupled to the two or more inspection tools. In another illustrative embodiment, the controller detects a set of candidate defects on the reticle based on a set of hot inspection images from the one or more hot reticle inspection tools. In another illustrative embodiment, the controller an inspection recipe for the one or more filtering reticle inspection tools based on the set of candidate defects, where the one or more filtering reticle inspection tools generate a set of filtering inspection images based on the inspection recipe. In another illustrative embodiment, the controller filters the set of candidate defects to a set of defects of interest using the set of filtering inspection images. In another illustrative embodiment, the controller outputs defect data associated with the set of defects of interest.

A reticle inspection system is disclosed in accordance with one or more illustrative embodiments of the present disclosure. In one illustrative embodiment, the system includes one or more hot reticle inspection tools configured for hot inspection of a reticle. In another illustrative embodiment, the system includes one or more filtering patterned-sample inspection tools configured for defect filtering, where the one or more filtering patterned-sample inspection tools are different than the one or more hot inspection tools. In another illustrative embodiment, the system includes a controller communicatively coupled to the two or more inspection tools. In another illustrative embodiment, the controller detects a set of candidate defects on the reticle based on a set of hot inspection images from the one or more hot reticle inspection tools. In another illustrative embodiment, the controller generates an inspection recipe for the one or more filtering patterned-sample inspection tools based on the set of candidate defects, where the one or more filtering reticle inspection tools generate a set of filtering inspection images based on the inspection recipe. In another illustrative embodiment, the controller filters the set of candidate defects to a set of defects of interest using the set of filtering inspection images. In another illustrative embodiment, the controller outputs defect data associated with the set of defects of interest.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
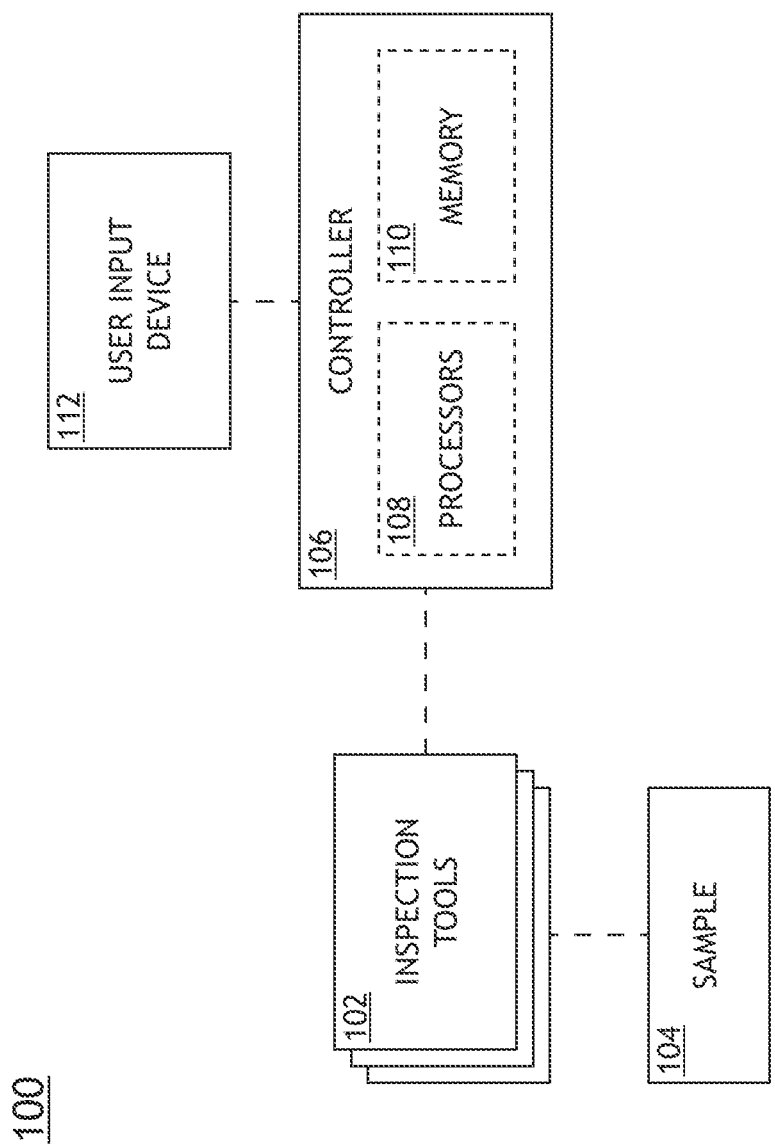
FIG. 1A is a conceptual view of an inspection system providing off-axis illumination and collection, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for multi-tool reticle characterization and quality control. Multi-tool reticle characterization may include direct reticle inspection and/or inspection of samples exposed to an image of the reticle (e.g., patterned samples).

A lithography system may operate by imaging a patterned reticle (e.g., a pattern mask) onto a photosensitive layer of a sample to expose the photosensitive layer with a desired pattern. A three-dimensional representation of this pattern may be generated in the sample layer through one or more subsequent processing steps such as, but not limited to, etching or lift-off steps.

A patterned reticle may generally include any combination of opaque, transmissive, or phase-modifying elements to provide a desired imaged pattern on the sample. For example, a transmissive reticle may include a transmissive substrate such as, but not limited to, quartz patterned with metallic elements to selectively block light in a desired pattern. Further, phase control may be provided through variations of the thickness and/or refractive index of the transmissive substrate.

In some applications, projection optics of the lithography system image the reticle onto the sample with a magnification less than one such that the imaged pattern on the sample is smaller (e.g., 4× smaller, 8× smaller, or the like) than the pattern on the reticle. Additionally, the reticle may include sub-resolution features having feature sizes smaller than a resolution of the projection optics designed to influence the imaged pattern on the sample. For example, although sub-resolution features may be not be fully resolved on the sample, sub-resolution features may impact the diffraction of light by the reticle and the interference of light on the sample for the generation of the image. In this way, sub-resolution features may be utilized to mitigate artifacts associated with printing at or near a resolution limit of the projection optics.

Defects in the reticle may generally directly impact the imaged pattern on the sample, which may in turn impact the performance, functionality, or reliability of the fully fabricated device. For the purposes of the present disclosure, a reticle defect includes any type of deviation of the reticle from a desired or designed specification. For example, reticle defects may include variations of the size, shape, orientation, or placement of pattern elements. By way of another example, reticle defects may include variations in the thickness or refractive index of either substrate or pattern materials. By way of another example, reticle defects may include damage to the sample such as, but not limited to, scratches, pits, or holes. By way of another example, reticle defects may include foreign particulates present on the reticle.

It is recognized herein that reticle defects may be observed or identified using a variety of inspection or metrology tools. For the purposes of the present disclosure, the terms inspection tool and metrology tool are used interchangeably and generally refer to tools designed to characterize one or more aspects of a sample including, but not limited to, sample properties (e.g., physical, optical, chemical, electrical, mechanical, or the like), properties of patterns on a sample (e.g., critical dimension (CD) tools, or the like) as well as any deviations of these patterns from design specifications, sample damage, or the presence of particulates.

It is further recognized herein that not all identifiable defects may have the same impact on the functionality or the reliability of a fabricated device. Accordingly, defects may be weighted or classified based on known or predicted impact on functionality or reliability. Additionally, it may be the case that different circuit designs or different working environments (e.g., mobile devices, automobile devices, or the like) may necessitate different thresholds for the functionality or reliability of a fabricated device.

Different inspection tools may have different strengths and weaknesses for the detection of defects on a sample (e.g., a reticle or a patterned sample). For example, optical inspection tools may characterize a sample by illuminating the sample with one or more wavelengths of light and capturing light from the sample (e.g., reflected light, transmitted light, scattered light, and/or diffracted light) to form an image or other representation of the sample. Optical inspection tools may generally benefit from a high measurement throughput but may have a resolution limited by the wavelength of illumination. By way of another example, particle-beam inspection tools may characterize a sample by illuminating or scan the sample with a particle beam (e.g., an electron beam, an ion beam, a neutral-density beam, or the like) and capturing emitted particles and/or light from the sample. Particle-beam inspection tools may generally benefit from a high resolution offered by the particle beam but may generally have a relatively low measurement throughput. By way of another example, actinic inspection tools may characterize a sample with extreme ultraviolet (EUV) light (e.g., 13.5 nm light, 7 nm light, or the like) that may be used in lithography tools during an exposure step. It is noted that although actinic inspection tools may be broadly classified as optical inspection tools due to the similar use of light during inspection, they are separately described herein due to substantive practical differences in the materials and optical layouts required for EUV light. Actinic inspection tools may have improved resolution than traditional optical inspection tools due to the lower illumination wavelengths but may have lower throughput due to lower illumination intensities at these wavelengths.

Additionally, the performance of a reticle may be characterized by directly inspecting the reticle itself for defects or by analyzing or simulating printed (e.g., imaged) patterns and comparing this data with reference data, which may be based on design specifications or a reference sample. For example, reticle performance may be characterized by lithographically imaging the reticle onto one or more samples, optionally followed by processing steps such as etching or lift-off, and inspection the physical samples with patterned-sample inspection tools. Such patterned-sample inspection tools may include any type of inspection tool including, but not limited to, optical inspection tools, particle-beam inspection tools, or actinic inspection tools. By way of another example, reticle performance may be characterized by simulating, modeling, or otherwise predicting how a particular reticle pattern will be imaged onto a sample. For instance, one or more inspection images of the reticle (e.g., generated by an optical, particle-beam, or actinic reticle inspection tool) may be used as an input to the simulation or model to generate a predicted imaged pattern.

Embodiments of the present disclosure are directed to systems and methods for characterizing reticle performance based on actively combining data from multiple inspection tools. In this way, the strengths of multiple tools may be leveraged to provide a higher level of performance than may be achieved through the use of a single inspection tool. For example, data from two or more reticle inspection tools having different illumination sources may be combined. By way of another example, data from one or more direct reticle inspection tools may be combined with data from one or more patterned-sample inspection tools. It is contemplated herein that combining data from reticle inspection tools providing a direct characterization of the reticle with data from patterned-sample inspection tools providing a characterization of the impact of any associated reticle defects may provide for an accurate analysis of both the existence of reticle defects and the impact of these defects.

It is further contemplated herein that systems and methods of the present disclosure may be applied to multiple pattern or pattern re qualification inspection techniques including, but not limited to, cell-to-cell (CC), die-to-die (DD), or die-to-database (DB) techniques. Further, performance may generally be defined as the identification and/or classification of defects of interest while limiting the number of false defects (e.g., those that do not exist) or nuisance defects (those that are deemed not to be critical for a particular application).

defect detection may typically be performed by comparing inspection data (e.g., inspection images) with one or more reference images to determine whether a defect is present in a particular portion of the sample or more generally by comparing images of multiple dies to. A variety of defect detection models may be utilized to compare inspection images to reference images, where different defect detection models may have (or may be configured to have) different sensitivities and/or may be tailored to detect different types or classes of defects. In some cases, a defect detection model provides a pixel-by-pixel determination of defectivity where adjacent or neighboring pixels may be, but are not required to be, grouped as a common defect associated with a common root cause.

In some embodiments, data from two or more inspection tools are combined by providing inspection data (e.g., inspection images) from multiple inspection tools as inputs to a multi-input defect detection model. In this way, the inspection images from the multiple inspection tools may be aligned and correlated such that areas or pixels of the inspection images associated with common portions of the reticle may be considered together. Further, a determination of whether a defect exists on a particular portion of the reticle may be based on the correlated inspection images. It is contemplated herein that actively combining multiple inspection images in this way may provide better performance than alternative techniques based on correlating separately-performed inspection results from multiple tools after defect detection models have separately been applied to the inspection images.

In some embodiments, data from two or more inspection tools are combined by identifying candidate sets of defects based on inspection images from multiple inspection tools followed by a joint analysis of the candidate sets of defects. For example, defects of interest may be identified as those defects that are present in a selected number (e.g., two or more) of the candidate sets of defects.

In some embodiments, data from different inspection tools are utilized in sequence. For example, one or more first inspection tools may be operated as "hot" inspection tools in which a defect detection sensitivity is high such that many candidate defects may be identified. Further, one or more second inspection tools are operated as filtering inspection tools to inspect portions of a sample including candidate defects, where an ultimate defect detection determination may be based on any combination of the inspection images from any of the inspection tools. It is contemplated herein that this approach may be particularly beneficial, but is not limited to, cases where the one or more second inspection tools have a relatively lower measurement throughput than the one or more first inspection tools. In this way, the one or more second inspection tools may be focused on portions of the sample identified as having candidate defects by the one or more first inspection tools.

Referring now generally to FIGS. 1A-4, system and methods for multi-tool reticle inspection and characterization are described in accordance with one or more embodiments of the present disclosure.

FIG. 1A is a conceptual view of an inspection system 100 providing off-axis illumination and collection, in accordance with one or more embodiments of the present disclosure.

In one embodiment, the inspection system 100 includes two or more inspection tools 102 suitable for inspecting a sample 104 (e.g., a reticle sample and/or a patterned sample) for defects. The two or more inspection tools 102 may generally include any type of inspection tools known in the art suitable for imaging any type of sample 104 for defects. For example, at least one of the two or more inspection tools 102 may include a reticle inspection tool 102 to inspect a reticle sample 104. Further, a reticle inspection tool 102 may characterize a reticle before patterning (e.g., a blank reticle) or after patterning (e.g., a reticle ready for use in a lithography system). EUV-based mask blank inspection is described generally in U.S. Pat. No. 8,711,346 to Stokowski, issued on Apr. 29, 2014, and U.S. Pat. No. 8,785,082 to Xiong et al., issued on Jul. 22, 2014, both of which are incorporated herein by reference in the entirety. By way of another example, at least one of the two or more inspection tools 102 may include a patterned-sample inspection tool 102 to inspect one or more layers of a patterned sample 104 (e.g., a patterned wafer) exposed to an image of the reticle. In this way, a patterned-sample inspection tool 102 may be useful for determining how defects in a reticle may impact printed patterns.

An inspection tool 102 may be configured as any type of inspection known in the art. In one embodiment, at least one of the two or more inspection tools 102 includes an optical inspection tool 102, which may image a sample 104 using optical illumination. For example, an optical inspection tool 102 may image a sample 104 using any illumination wavelength or range of wavelengths including, but not limited to, ultraviolet (UV), visible, or infrared (IR) wavelengths. In another embodiment, at least one of the two or more inspection tools 102 includes a particle-beam inspection tool 102, which may image a sample 104 with a particle beam such as, but not limited to, an electron beam, an ion beam, or a neutral beam. For example, a particle-beam inspection tool 102 may include a scanning inspection tool that may form an image by scanning a particle beam across the sample and detecting radiated particles from the sample 104. In another embodiment, at least one of the two or more inspection tools 102 includes an actinic inspection tool 102, which may image a sample 104 using extreme ultraviolet (EUV) illumination (e.g., at 13.5 nm) having wavelengths used for lithographic imaging of samples with reticle patterns.

Further, the inspection system 100 may include any combination of reticle inspection tools 102 configured to inspect a reticle or patterned-sample inspection tools 102 configured to inspect a patterned sample (e.g., a sample including patterns formed from exposure to an image of the reticle). For example, the inspection system 100 may include one or more reticle inspection tools 102 configured as optical, particle-beam and/or actinic tools. By way of another example, the inspection system 100 may include one or more patterned-sample inspection tools 102 configured as optical, particle-beam and/or actinic tools In some embodiments, the inspection system 100 includes at least two of an optical inspection tool 102, a particle-beam inspection tool 102, or an actinic inspection tool 102. In this way, the different strengths of the multiple inspection tools 102 may be leveraged to provide a higher level of performance than may be possible with any of the tools alone.

In another embodiment, the inspection system 100 includes a controller 106. In another embodiment, the controller 106 includes one or more processors 108 configured to execute program instructions maintained on a memory medium 110 (e.g., memory). In this regard, the one or more processors 108 of controller 106 may execute any of the various process steps described throughout the present disclosure.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., a networked computer) configured to execute a program configured to operate the inspection system 100, as described throughout the present disclosure. It is further recognized that the term "processor" may be broadly defined to encompass any device having one or more processing elements, which execute program instructions from a non-transitory memory medium 110.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random-access memory, a magnetic or optical memory device (e.g., disk), a magnetic tape, a solid state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

The controller 106 may be communicatively coupled with any component of the inspection system 100 or any additional components outside of the inspection system 100. In one embodiment, the controller 106 may be configured to receive data from any of the inspection tools 102 or components therein (e.g., one or more detectors). For example, the controller 106 may receive any combination of raw data, image data, processed data (e.g., inspection results), and/or partially-processed data. In another embodiment, the controller 106 may perform processing steps on the received data. For example, the controller 106 may perform defect inspection steps such as, but not limited to, defect identification, classification, or sorting.

Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into the inspection system 100. For instance, the controller 106 may operate as a centralized processing platform. In another instance, the controller 106 may be distributed such that portions of the controller 106 may be implemented in and/or housed in any combination of the inspection tools.

In another embodiment, the controller 106 may control and/or direct (e.g., via control signals) any component of the inspection system 100. For example, any combination of elements of the illumination pathway 120 and/or the collection pathway 130 may be adjustable. In this regard, the controller 106 may modify any combination of illumination conditions or imaging conditions.

In one embodiment, the inspection system 100 includes a user interface 112 is communicatively coupled to the controller 106. In one embodiment, the user interface 112 may include, but is not limited to, one or more desktops, laptops, tablets, and the like. In another embodiment, the user interface 112 includes a display used to display data of the inspection system 100 to a user. The display of the user interface 112 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 112 is suitable for implementation in the present disclosure. In another embodiment, a user may input selections and/or instructions responsive to data displayed to the user via a user input device of the user interface 112.

Figure 1B:
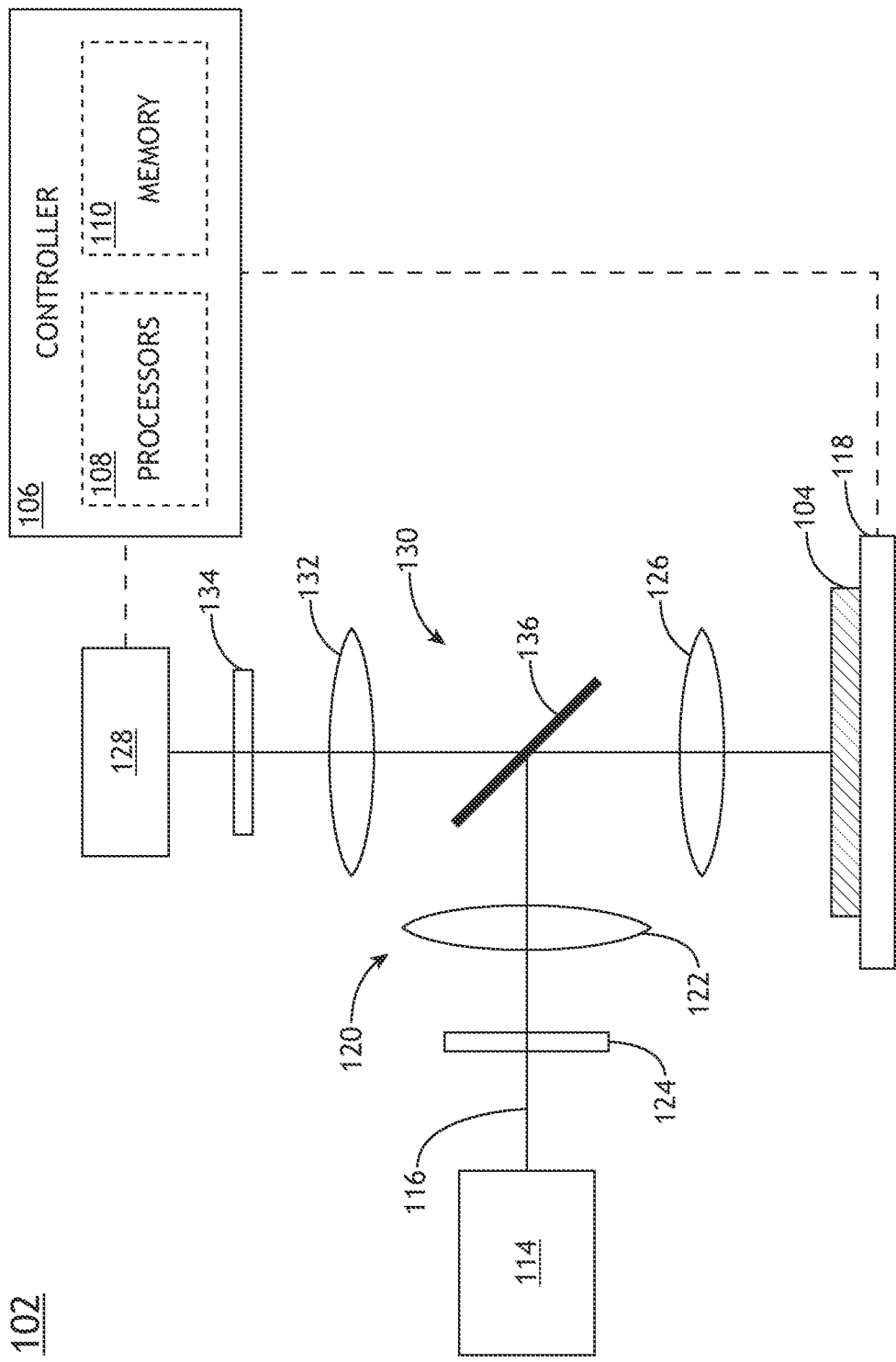
FIG. 1B is a conceptual view of an optical inspection tool in accordance with one or more embodiments of the present disclosure in accordance with one or more embodiments of the present disclosure.
Figure 1C:
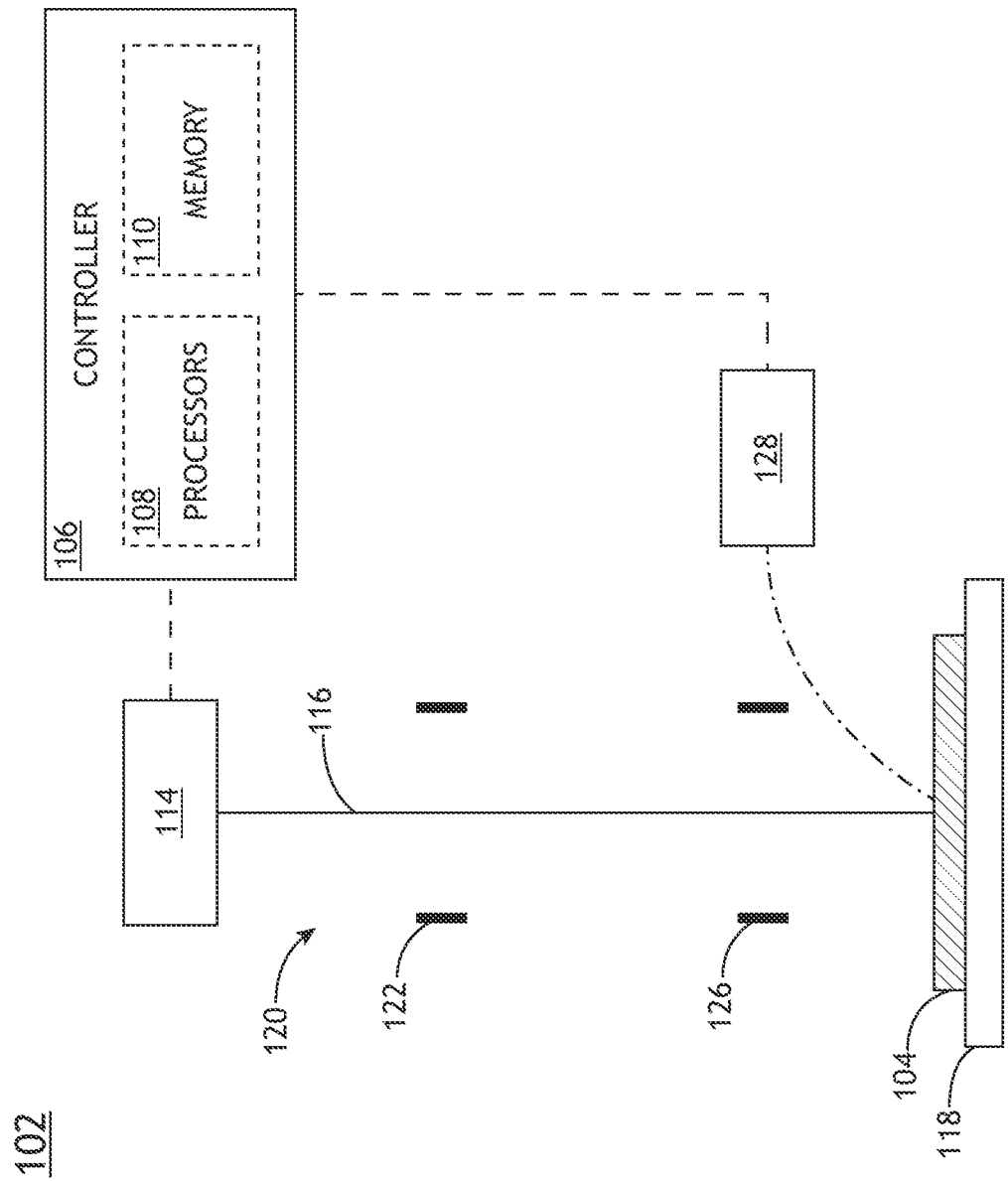
FIG. 1C is a conceptual view of a particle-beam inspection tool, in accordance with one or more embodiments of the present disclosure.
Figure 1D:
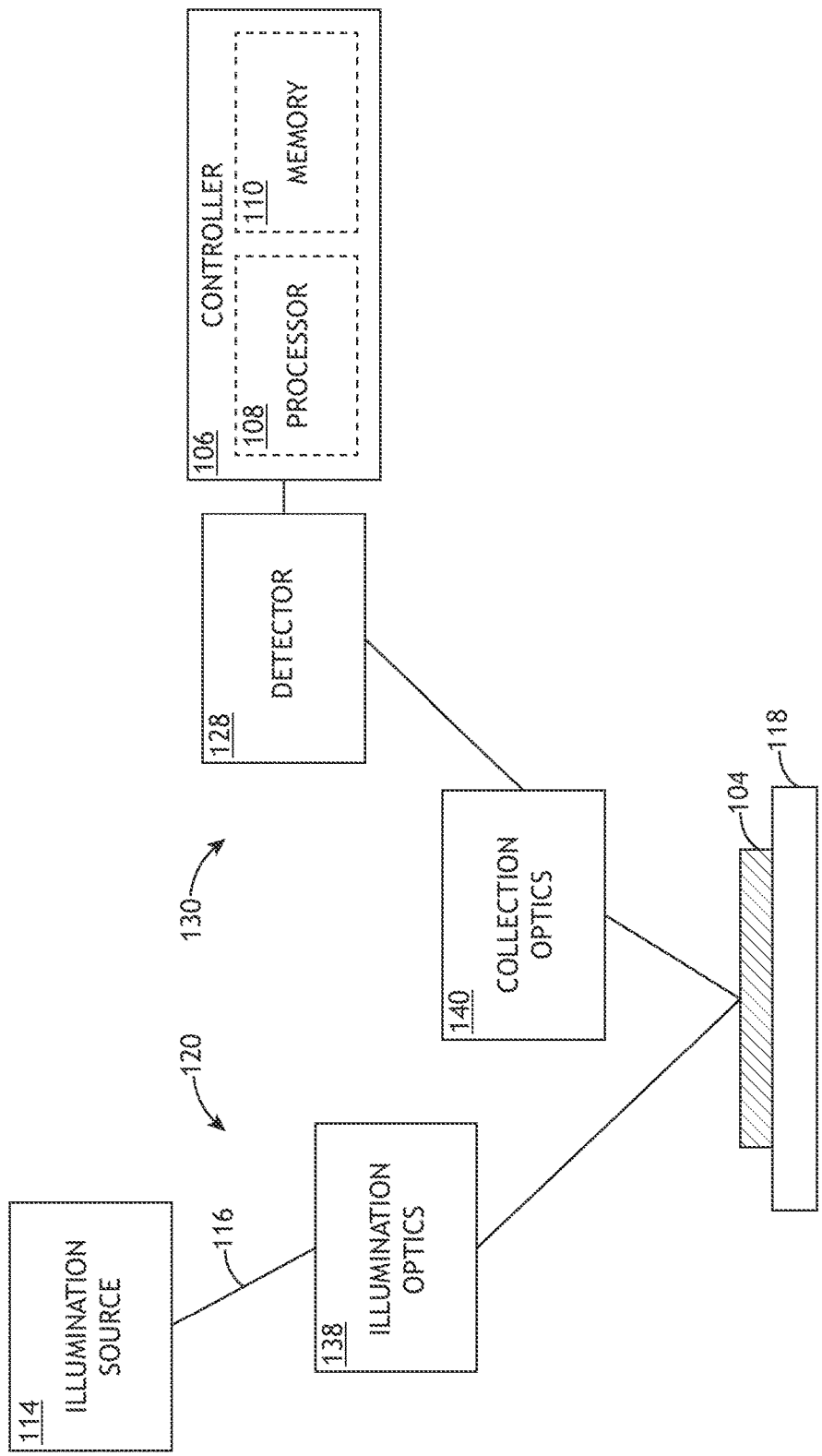
FIG. 1D is a conceptual view of an actinic inspection tool configured as an actinic, in accordance with one or more embodiments of the present disclosure.

In another embodiment, although not shown, the inspection system 100 may include a lithography system such as, but not limited to, an EUV lithography system. In one embodiment, the lithography system may include a set of illuminator optics configured to direct output light from an illumination source to a reticle suitable for providing patterns to be exposed on a wafer. In this regard, the lithography system includes a set of projection optics configured to receive illumination reflected from the mask and direct the reflected illumination from the mask to one or more wafers disposed on a wafer stage. The optical system may include any lithography system known in the art. EUV-based lithography is described generally in U.S. Pat. No. 8,916,831 to Wang, issued on Dec. 23, 2014, which is incorporated herein by reference in the entirety. Referring now to FIGS. 1B-1D, various configurations of an inspection tool 102 are described in greater detail in accordance with one or more embodiments of the present disclosure. It is contemplated herein that the configurations illustrated in FIGS. 1B-1D may generally refer to reticle inspection tools 102 for directly imaging a reticle or patterned-sample inspection tools 102 for imaging a sample patterned with an image of a reticle.

An inspection tool 102 may operate in either a direct imaging mode or a scanning imaging mode. For example, an inspection tool 102 operating in a direct imaging mode may illuminate a portion of the sample 104 larger than the system resolution and capture an image of the illuminated portion of the sample 104 on a detector. The captured image may be any type of image known in the art such as, but not limited to, a brightfield image, a darkfield image, a phase-contrast image, or the like. Further, captured images may be stitched together (e.g., by the controller 106) to form a composite image of the sample 104. By way of another example, an inspection tool 102 operating in a scanning mode may scan a focused beam across the sample 104 and capture radiation and/or particles emanating from the sample 104 on one or more detectors at one or more measurement angles. The focused beam may be scanned across the sample 104 by modifying the beam path (e.g., using a galvo mirror, a piezo-electric mirror, or the like) and/or by translating the sample 104 through a focal volume of the focused beam. The captured radiation may then be stitched together (e.g., by the controller 106, or the like) to form a composite image of the sample 104.

FIG. 1B is a conceptual view of an optical inspection tool 102 in accordance with one or more embodiments of the present disclosure in accordance with one or more embodiments of the present disclosure.

In one embodiment, the inspection tool 102 includes an illumination source 114 configured to generate an illumination beam 116. The illumination beam 116 may include one or more selected wavelengths of light including, but not limited to, ultraviolet (UV) radiation, visible radiation, or infrared (IR) radiation.

The illumination source 114 may be any type of illumination source known in the art suitable for generating an optical illumination beam 116. In one embodiment, the illumination source 114 includes a broadband plasma (BBP) illumination source. In this regard, the illumination beam 116 may include radiation emitted by a plasma. For example, a BBP illumination source 114 may include, but is not required to include, one or more pump sources (e.g., one or more lasers) configured to focus pump light into a volume of a gas, causing energy to be absorbed by the gas in order to generate or sustain a plasma suitable for emitting radiation. Further, at least a portion of the plasma radiation may be utilized as the illumination beam 116. In another embodiment, the illumination source 114 may include one or more lasers. For instance, the illumination source 114 may include any laser system known in the art capable of emitting radiation in the infrared, visible, or ultraviolet portions of the electromagnetic spectrum.

In another embodiment, the illumination source 114 directs the illumination beam 116 to a sample 104 disposed on a sample stage 118 via an illumination pathway 120. The illumination pathway 120 may include one or more illumination-pathway focusing elements 122 or additional illumination-pathway optical components 124 suitable for modifying and/or conditioning the illumination beam 116. For example, the one or more illumination-pathway optical components 124 may include, but are not limited to, one or more polarizers, one or more filters, one or more beam splitters, one or more diffusers, one or more homogenizers, one or more stops, one or more apertures, one or more apodizers, or one or more beam shapers. In another embodiment, the inspection tool 102 includes an objective lens 126 to focus or otherwise direct the illumination beam 116 onto the sample 104.

In another embodiment, the inspection tool 102 includes a detector 128 configured to capture radiation emanating from the sample 104 through a collection pathway 130. For example, a detector 128 may receive an image of the sample 104 provided by elements in the collection pathway 130 (e.g., the objective lens 126, one or more collection-pathway focusing elements 132, or the like). The collection pathway 130 may further include any number of collection-pathway optical elements 134 to direct and/or modify illumination collected by the objective lens 126 including, but not limited to, one or more filters, one or more polarizers, or one or more beam blocks.

The detector 128 may include any type of optical detector known in the art suitable for measuring illumination received from the sample 104. For example, a detector 128 may include, but is not limited to, a charge-coupled device (CCD) detector, a time-domain-integration (TDI) detector, a photomultiplier tube (PMT), an avalanche photodiode (APD), or the like. In another embodiment, a detector 128 may include a spectroscopic detector suitable for identifying wavelengths of radiation emanating from the sample 104. In another embodiment, the inspection tool 102 may include multiple detectors 128 (e.g., associated with multiple beam paths generated by one or more beamsplitters to facilitate multiple metrology measurements by the inspection tool 102).

In one embodiment, as illustrated in FIG. 1B, the inspection tool 102 may include a beamsplitter 136 oriented such that the objective lens 126 may simultaneously direct the illumination beam 116 to the sample 104 and collect radiation emanating from the sample 104. In another embodiment, the angle of incidence of the illumination beam 116 on the sample 104 is adjustable. For example, the path of the illumination beam 116 through the beamsplitter 136 and the objective lens 126 may be adjusted to control the angle of incidence of the illumination beam 116 on the sample 104.

In another embodiment, the inspection tool 102 is communicatively coupled to the controller 106 of the inspection system 100. In this regard, the controller 106 may be configured to receive data including, but not limited to, metrology images.

FIG. 1C is a conceptual view of a particle-beam inspection tool 102, in accordance with one or more embodiments of the present disclosure. In one embodiment, the illumination source 114 includes a particle source (e.g., an electron beam source, an ion beam source, a neutral particle beam source or the like) such that the illumination beam 116 includes a particle beam (e.g., an electron beam, a particle beam, a neutral particle beam or the like). The illumination source 114 may include any particle source known in the art suitable for generating an illumination beam 116. For example, the illumination source 114 may include, but is not limited to, an electron gun or an ion gun. In another embodiment, the illumination source 114 is configured to provide a particle beam with a tunable energy. For example, an illumination source 114 including an electron source may, but is not limited to, provide an accelerating voltage in the range of 0.1 kV to 30 kV. As another example, an illumination source 114 including an ion source may, but is not required to, provide an ion beam with an energy in the range of 1 to 50 keV.

In another embodiment, the illumination pathway 120 includes one or more particle focusing elements (e.g., illumination-pathway focusing elements 122, or the like). For example, the one or more particle focusing elements may include, but are not limited to, a single particle focusing element or one or more particle focusing elements forming a compound system. In another embodiment, the one or more particle focusing elements include objective lens 126 configured to direct the illumination beam 116 to the sample 104. Further, the one or more particle focusing elements may include any type of electron lenses known in the art including, but not limited to, electrostatic, magnetic, uni-potential, or double-potential lenses. It is noted herein that the description of an imaging metrology tool as depicted in FIG. 1C and the associated descriptions above are provided solely for illustrative purposes and should not be interpreted as limiting. For example, the illumination source 114 may include any excitation source known in the art suitable for generating metrology data on a sample 104. In another embodiment, the inspection tool 102 includes two or more particle beam sources (e.g., electron beam sources or ion beam sources) for the generation of two or more particle beams. In a further embodiment, the inspection tool 102 may include one or more components (e.g., one or more electrodes) configured to apply one or more voltages to one or more locations of the sample 108. In this regard, the inspection tool 102 may generate voltage contrast imaging data.

In another embodiment, the inspection tool 102 includes one or more particle detectors 128 to image or otherwise detect particles emanating from the sample 104. In one embodiment, the detector 128 includes an electron collector (e.g., a secondary electron collector, a backscattered electron detector, or the like). In another embodiment, the detector 128 includes a photon detector (e.g., a photodetector, an x-ray detector, a scintillating element coupled to photomultiplier tube (PMT) detector, or the like) for detecting electrons and/or photons from the sample surface.

FIG. 1D is a conceptual view of an actinic inspection tool 102 configured as an actinic, in accordance with one or more embodiments of the present disclosure. As described previously herein, an actinic inspection tool 102 may be a variation of an optical inspection tool 102 (e.g., as described with respect to FIG. 1B) but with an EUV illumination source and optical elements configured for EUV wavelengths such as those used for lithographic projection of reticle patterns to a sample. EUV Imaging is described generally in U.S. Pat. No. 8,842,272 to Wack, issued on Sep. 23, 2014, which is incorporated herein by reference in the entirety.

In one embodiment, the inspection system 100 includes an illumination source 114 to generate an illumination beam 116 including one or more selected wavelengths of light including, but not limited to, ultraviolet (UV), extreme ultraviolet (EUV), deep ultraviolet (DUV), or vacuum ultraviolet (VUV) radiation. For example, at least a portion of a spectrum of the illumination beam 116 may include wavelengths below approximately 120 nanometers. By way of another example, at least a portion of a spectrum of the illumination beam 116 may include wavelengths associated with a lithography device suitable for semiconductor fabrication such as, but not limited to, 13.5 nm, 7 nm, or the like (e.g., actinic wavelengths)

The illumination source 114 may be any type of illumination source known in the art suitable for generating an illumination beam 116 with the desired wavelengths. In one embodiment, the illumination source 114 includes a broadband illumination source such as, but not limited to, a broadband plasma (BBP) illumination source. Further, the illumination source 114, or the inspection tool 102 more generally, may include a spectral filter designed to pass selected actinic wavelengths. For example, a BBP illumination source 114 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 116. In another embodiment, the illumination source 114 may include one or more lasers capable of emitting radiation at one or more selected wavelengths.

The illumination source 114 may further produce an illumination beam 116 having any temporal profile. For example, the illumination source 114 may produce a continuous illumination beam 116, a pulsed illumination beam 116, or a modulated illumination beam 116.

In another embodiment, the illumination pathway 120 includes one or more illumination optics 138 suitable for directing, focusing, and/or shaping the illumination beam 116 with EUV wavelengths. For instance, the illumination optics 138 may include reflective optics suitable for directing and/or focusing low-wavelength light such as, but not limited to, flat mirrors or curved mirrors (e.g., elliptical mirrors, parabolic mirrors, or the like). Similarly, the collection pathway 130 may include one or more collection optics 140 for directing and/or focusing low-wavelength light received from the sample 104.

Figure 2:
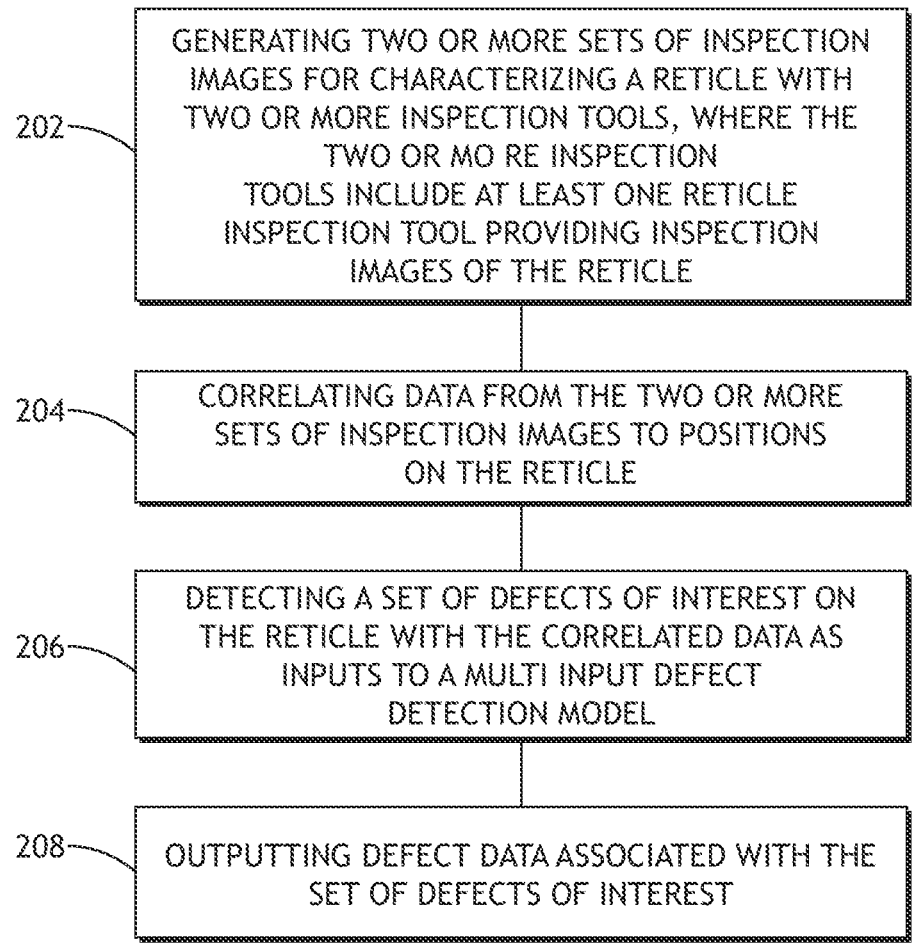
FIG. 2 is a flow diagram illustrating steps performed in an inspection method in accordance with one or more embodiments of the present disclosure.
Figure 3:
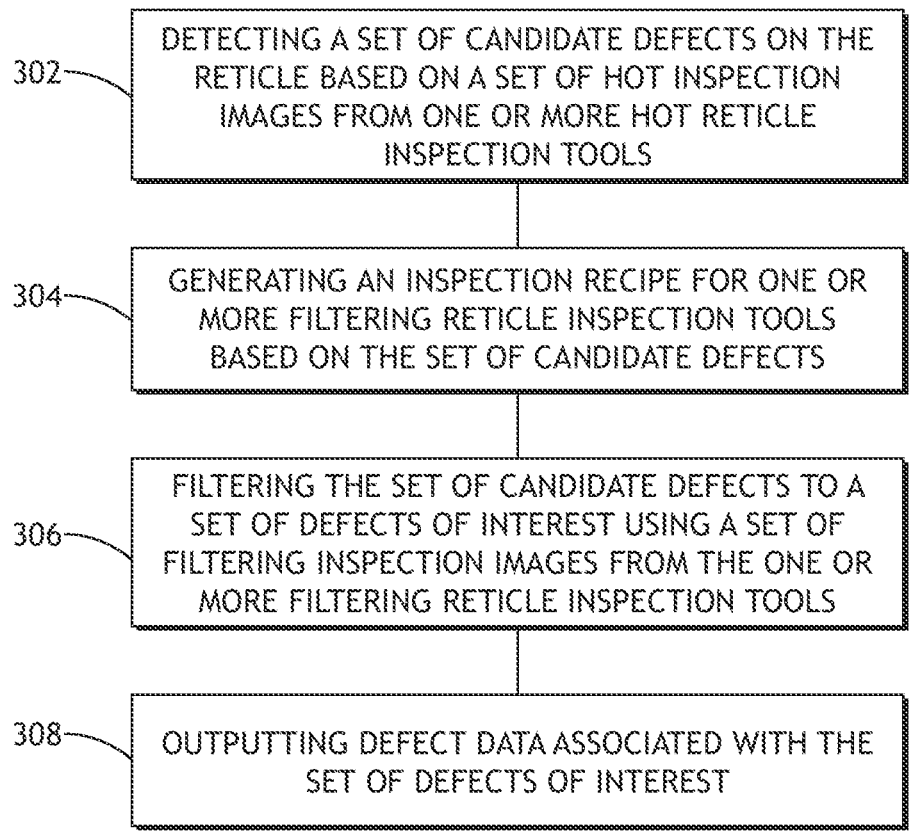
FIG. 3 is a flow diagram illustrating steps performed in an inspection method in accordance with one or more embodiments of the present disclosure.
Figure 4:
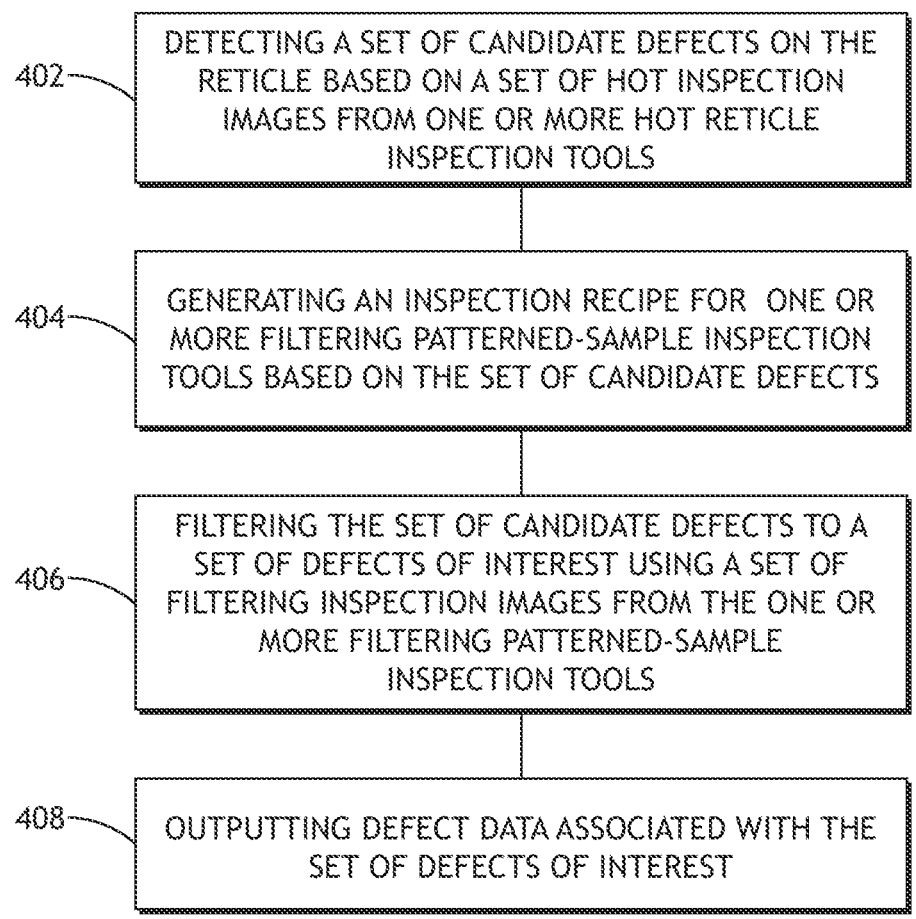
FIG. 4 is a flow diagram illustrating steps performed in an inspection method in accordance with one or more embodiments of the present disclosure.

Referring now to FIGS. 2-4, methods for multi-tool reticle inspection and characterization are described in greater detail in accordance with one or more embodiments of the present disclosure.

FIG. 2 is a flow diagram illustrating steps performed in an inspection method 200 in accordance with one or more embodiments of the present disclosure. Applicant notes that the embodiments and enabling technologies described previously herein in the context of the inspection system 100 should be interpreted to extend to the method 200. It is further noted, however, that the method 200 is not limited to the architecture of the inspection system 100.

In one embodiment, the method 200 includes a step 202 of generating two or more sets of inspection images for characterizing a reticle with two or more inspection tools. In particular, the two or more inspection tools may inspect a common portion of the reticle. Further, the two or more inspection tools may include at least one reticle inspection tool providing inspection images of the reticle. For example, the two or more inspection tools may include, but are not limited to, the optical inspection tool 102 illustrated in FIG. 1B, the particle-beam inspection tool 102 illustrated in FIG. 1C, or the actinic inspection tool 102 illustrated in FIG. 1D.

Additionally, in some embodiments, the two or more inspection tools additionally include at least one patterned-sample inspection tool, which may also include, but is not limited to, the optical inspection tool 102 illustrated in FIG. 1B, the particle-beam inspection tool 102 illustrated in FIG. 1C, or the actinic inspection tool 102 illustrated in FIG. 1D. It is contemplated herein that reticle inspection may be improved by a combined analysis of inspection images generated through direct imaging of the reticle itself and of inspection images generated through imaging of a sample exposed by the reticle. In this way, the inspection images from the reticle inspection tools may provide information regarding the structure of the reticle as well as any identified defects, and the inspection images from the patterned-sample inspection tools may provide information regarding the impact of the structure of the reticle (including any identified defects) on the lithography process. In this way, the severity of any particular identified defect on the reticle may be assessed.

In another embodiment, the method 200 includes a step 204 of correlating data from the two or more sets of inspection images to positions on the reticle. In this way, defect detection for any particular position on the reticle may be determined based on an analysis of data from any combination of the inspection images including that particular position. It is contemplated herein that different inspection tools may image the reticle with different resolutions. For example, a particle-beam inspection tool may provide inspection images with higher resolutions than an optical inspection tool. Accordingly, the step 204 of correlating data from the two or more sets of inspection images to position on the reticle may include scaling or otherwise compensating for the different image resolutions.

In embodiments in which at least one of the sets of inspection images are generated by a patterned-sample inspection tool, the step 204 of correlating data from the two or more sets of inspection images to position on the reticle may include correlating inspection data associated with a particular position on the patterned sample with a corresponding position on the reticle. In this way, inspection data on the patterned sample associated with a particular portion of the reticle may be correlated with inspection data associated with direct imaging of that portion of the reticle by another inspection tool. Further, defects identified on the patterned sample may be correlated to reticle defects. Additionally, the step 204 may include compensating for the different physical sizes of pattern elements on the reticle and the images of those pattern elements on a printed sample. For example, typical lithography systems may be configured such that the reticle is 4× larger than the associated exposed image on the patterned sample. Further, as fabricated feature sizes of devices continue to shrink, the magnification (or demagnification) of the reticle during lithography may become even more significant. Accordingly, inspection images from patterned-beam inspection tools may be scaled or otherwise compensated such that they may be directly correlated with inspection images from reticle inspection tools.

In another embodiment, the method 200 includes a step 206 of detecting one or more defects of interest on the reticle with the correlated data as inputs to a multi-input defect detection model. For example, the multi-input defect detection model may determine defects for any particular position on the reticle based on analysis of the correlated data associated with the particular position. In another embodiment, the method 200 includes a step 208 of outputting defect data associated with the defects of interest. The output data may include any type of data associated with the defects of interest including, but not limited to, a position on the reticle, a defect type or class, or an image of the defect.

It is contemplated herein that analysis of a common portion of the reticle with multiple inspection tools may generally require sequential inspection of the reticle with the multiple inspection tools. Accordingly, at least some of the sets of inspection images may be stored in a memory device (e.g., the memory medium 110 in FIG. 1A) and retrieved (or played back) during analysis (e.g. during the step 204 of correlating data to position on the reticle and/or during step 206 of detecting one or more defects of interest on the reticle with the correlated data as inputs to a multi-input defect detection model). In this way, all sets of inspection images may be analyzed by the multi-input defect detection model together.

In another embodiment, the sets of inspection images may be received from different sources. It is recognized herein that some defect detection models are designed to perform at least some defect analysis steps on a data stream from the inspection tool concurrently with the inspection. For example, the inspection system may divide analysis of the inspection images into various jobs for processing, where a job may include an inspection image (or a portion thereof) and one or more reference images. In this way, the inspection speed (e.g., the rate at which inspection images are generated) may be balanced with the processing of the inspection images, where balancing may be achieved by any combination of adjusting the inspection speed or selectively dropping jobs.

Accordingly, in one embodiment, one set of inspection images is received from one of the inspection tools during runtime (potentially with a buffer to facilitate data transfer) and one or more additional sets of inspection images are received (or played back) from a memory device. For example, the inspection images stored in a memory device may be played back such that they are synchronized to inspection images from another inspection tool (e.g., the inspection images stored in the memory device and the inspection images generated during run-time may be presented as a single synchronized data stream. In this way, the multi-input defect detection model may similarly perform at least some defect analysis steps from a data stream including all sets of inspection images.

It is further contemplated herein that the step 206 of detecting one or more defects of interest on the reticle with the correlated data as inputs to a multi-input defect detection model may be carried out in multiple ways within the spirit and scope of the present disclosure. Accordingly, it is to be understood that the following examples are provided solely for illustrative purposes and should not be interpreted as limiting. Rather, any technique for detecting one or more defects of interest on the reticle with the correlated data as inputs to a multi-input defect detection model is within the spirit and scope of the present disclosure.

In one embodiment, the multi-input defect detection model detects defects of interest by generating defectivity scores for each particular location on the reticle based on each of the two or more sets of inspection images, aggregating the defectivity scores to generate an aggregated defectivity score for each particular location on the reticle, and identifying defects of interest across the reticle based on the aggregated defectivity scores. For example, a first set of defectivity scores may be generated for each particular location on the reticle based on a first set of inspection images, a second set of defectivity scores may be generated for each particular location on the reticle based on a second set of inspection images, and the like. Then, an aggregated defectivity score for each particular location on the reticle may be generated based on a combination of the various sets of defectivity scores (e.g., the first set of defectivity scores, the second set of defectivity scores, and so on). Finally, defects of interest may be identified based on the aggregated defectivity scores using various techniques including, but not limited to, defining a cutoff aggregated defectivity score or a pattern analysis of the aggregated defectivity scores.

In this way, the aggregated defectivity scores for various locations across the reticle may be the result of a combined defectivity analysis of each of the two or more sets of inspection images. Further, it is contemplated herein that such a combined defectivity analysis as a multi-input defect detection model may provide higher performance defect detection than alternative multi-tool inspection methods in which identified defects generated based off of separate analysis of inspection images from multiple tools are subsequently analyzed.

Additionally, in some embodiments, the defectivity scores for each particular location associated with each of the two or more sets of inspection images may be weighted prior to aggregation. For example, defectivity scores based on inspection images from a relatively sensitive tool (e.g., a particle-beam inspection tool, an actinic inspection tool, or the like) may be weighted with relatively higher weights than defectivity scores based on inspection images from a relatively lower-sensitivity tool (e.g., an optical inspection tool, or the like). By way of another example, defectivity scores may be weighted based on known or measured information about a particular defect such as, but not limited to, defect type or classification. In this way, defect types or classes predicted to have a greater impact on functionality, performance, or reliability may be weighted with relatively higher weights.

In another embodiment, the multi-input defect detection model detects defects of interest by detecting candidate sets of defects for each of the two or more sets of inspection images (e.g., from different inspection tools) and identifying defects of interest based on the multiple candidate sets of defects. In this way, the analysis may be similar to the generation of defectivity scores as described above, but may differ in that candidate defect determinations (as opposed to a score that may be used to determine whether a defect of interest exists) may be separately made based on each set of inspection images. Subsequently, defects of interest may be identified based on a combined defect detection model or algorithm. For example, defects that are present in a selected number of the candidate sets of defects (e.g., two or more) may be identified as defects of interest by the multi-input defect detection model. By way of another example, the candidate sets of defects may be weighted based on factors such as, but not limited to, the sensitivity of the associated inspection tool or the defect type or class prior to utilization of a combined defect detection model or algorithm. For instance, defects of a certain type or class existing in a selected number of the candidate sets of defects (e.g., one or more) may be identified as defects of interest.

Referring now generally to FIG. 2, various non-limiting examples of inspection tools suitable for use in the method 200 are described in accordance with one or more embodiments of the present disclosure. It is to be understood, however, that the specific examples herein are provided solely for illustrative purposes and should not be interpreted as limiting.

In one embodiment, the two or more inspection tools include at least one reticle inspection tool and at least one patterned-sample inspection tool. In this way, a reticle may be inspected based on direct imaging of the reticle using the reticle inspection tool as well as an analysis of at least one printed sample patterned by exposure to an image of the reticle. Accordingly, defects of interest may be attributable to defects or deviations in the reticle that result in substantive errors in the patterning process.

Further, the reticle inspection tool and the patterned-sample inspection tool may have the same type of illumination source or may have different types of illumination sources. For example, the reticle inspection tool and the patterned-sample inspection tool may both include optical inspection tools, particle-beam inspection tools, actinic inspection tools, or the like. By way of another example, the reticle inspection tool includes an optical inspection tool, while the patterned-sample inspection tool includes a particle-beam inspection tool or an actinic inspection tool. By way of another example, the reticle inspection tool includes a particle-beam inspection tool, while the patterned-sample inspection tool includes an optical inspection tool or an actinic inspection tool. By way of another example, the reticle inspection tool includes an actinic inspection tool, while the patterned-sample inspection tool includes an optical inspection tool or a particle-beam inspection tool.

Additionally, it is contemplated herein that the inspection images from the reticle inspection tool and the patterned-sample inspection tool may be generated simultaneously or sequentially. In the case that the inspection images are obtained simultaneously, one or more defect inspection steps (e.g., step 204 and/or step 206 in FIG. 2) may be performed, but is not required to be performed, during runtime based on an image stream generated in runtime from both the reticle inspection tool and the patterned-sample inspection tool. Alternatively, one or more of the sets of inspection images may be stored in a memory device and played back for defect detection.

In another embodiment, the two or more inspection tools include at least two reticle inspection tools. In this way, the reticle inspection may benefit from the combined strengths of the different reticle inspection tools (e.g., different sensitivities, different resolutions, or the like). For example, the two or more reticle inspection tools may include an optical inspection tool and a particle-beam inspection tool. By way of another example, the two or more reticle inspection tools may include an optical inspection tool and an actinic inspection tool. By way of another example, the two or more reticle inspection tools may include a particle-beam inspection tool and an actinic inspection tool.

Additionally, as previously described herein, it is contemplated herein that inspection of a common portion of the reticle with multiple inspection tools may require sequential inspection by the multiple tools. Accordingly, inspection images from any or all of the inspection tools may be stored in memory and played back during analysis. Similarly, inspection images from any of the inspection tools may be processed during runtime while the remaining sets of inspection images from previous inspections are played back.

Referring now to FIG. 3, FIG. 3 is a flow diagram illustrating steps performed in an inspection method 300 in accordance with one or more embodiments of the present disclosure. Applicant notes that the embodiments and enabling technologies described previously herein in the context of the inspection system 100 should be interpreted to extend to the method 300. It is further noted, however, that the method 300 is not limited to the architecture of the inspection system 100.

In one embodiment, the method 300 includes a step 302 of detecting a set of candidate defects on the reticle based on a set of hot inspection images from one or more hot reticle inspection tools.

In another embodiment, the method 300 includes a step 304 of generating an inspection recipe for the one or more filtering reticle inspection tools based on the set of candidate defects. In this way, the one or more filtering reticle inspection tools may generate a set of filtering inspection images based on the inspection recipe.

The one or more hot reticle inspection tools may include any combination of one or more optical reticle inspection tools, particle-beam reticle inspection tools, or actinic reticle inspection tools. Similarly, the one or more filtering reticle inspection tools may include any combination of one or more optical reticle inspection tools, particle-beam reticle inspection tools, or actinic reticle inspection tools, where the one or more filtering reticle inspection tools includes a different combination of tools than the one or more hot reticle inspection tools.

Further, it is to be understood that the term hot reticle inspection tool is used in the context of the present disclosure to refer to an inspection tool configured to detect or identify candidate defects that may be subsequently filtered down to provide a set of output defects of interest based on data from the one or more filtering inspection tools. In this way, the candidate defects identified by the hot inspection tool may include both defects of interest and nuisance defects (e.g., defects deemed to have an acceptably low impact on printability, performance, reliability, or the like). However, a two-step process of identifying candidate defects with a hot inspection tool and filtering these defects based on the data from the one or more filtering reticle inspection tools to provide defects of interest may more reliably capture defects of interest than inspection with a single inspection tool configured to capture only the defects of interest. In some cases, a hot inspection tool is configured to provide defect detection with a relatively high sensitivity to generate the list of candidate defects. However, in the context of the present disclosure, a hot inspection tool need not have any particular configuration or sensitivity. In some cases, the term hot inspection tool is provided merely as a label to distinguish the tool from a different inspection tool (e.g., a filtering inspection tool) having different properties and/or inherent characteristics.

An inspection recipe may include any information required to control or direct the one or more filtering tools to generate inspection images such as, but not limited to, portions of the reticle to inspect or parameters of the tool during inspection (e.g., wavelength, beam energy, illumination angle, or the like). Further, the inspection recipe generated in the step 304 may include the entire reticle (or portion thereof inspected by the one or more hot reticle inspection tools) or may be limited to those areas of the reticle that include the set of candidate defects. For example, inspecting the entire reticle may facilitate detection of defects of interest by the filtering inspection tools that were not detected by the hot reticle inspection tools. However, inspecting the entire reticle may negatively impact throughput in some cases. By way of another example, inspecting only areas of the reticle that include the set of candidate defects may provide targeted filtering with less of an impact on the throughput, which may be particularly useful, but not limited to, cases where the filtering inspection tools have relatively low measurement throughputs (e.g., particle-beam inspection tools). In a general sense, the inspection recipe may be generated by balancing various factors such as, but not limited to, the size of the sample, the number of candidate defects, the locations of the candidate defects, the throughput of the particular inspection tool, and any penalties for inspecting only selected portions of the sample (e.g., penalties associated with stopping and starting a translation stage near the candidate defects).

In another embodiment, the method 300 includes a step 306 of filtering the set of candidate defects to a set of defects of interest using the set of filtering inspection images. In another embodiment, the method 300 includes a step 308 of outputting defect data associated with the set of defects of interest. The output data may include any type of data associated with the defects of interest including, but not limited to, a position on the reticle, a defect type or class, or an image of the defect.

It is contemplated herein that the step 306 of filtering the set of candidate defects to a set of defects of interest using the set of filtering inspection images may be carried out in multiple ways within the spirit and scope of the present disclosure. Accordingly, it is to be understood that the following examples are provided solely for illustrative purposes and should not be interpreted as limiting. Rather, any technique for filtering the set of candidate defects to a set of defects of interest using the set of filtering inspection images is within the spirit and scope of the present disclosure.

In one embodiment, filtering the set of candidate defects to a set of defects of interest includes detecting one or more additional sets of candidate defects in the selected portions of the reticle associated with the inspection recipe and identifying defects present in the set of candidate defects and a selected number of the one or more additional sets of candidate defects as defects of interest. In this way, filtering may be achieved based on detection with multiple inspection tools. Further, the selected number may include any suitable number including, but not limited to, two or more of the additional sets of candidate defects. In a general sense, the selected number may provide a filtering threshold. For example, if a particular defect is identified in multiple candidate sets of defects, a confidence level in the identification of that particular defect as a defect of interest may be relatively high. Conversely, if a particular defect is only identified in a single candidate set of defects, the confidence level may be relatively low.

Additionally, in some embodiments, defects identified by one tool but not another tool may be classified as defects of interest. For example, it may be the case that certain classes of defects of interest are readily detectable using some tools, but not others. In this way, the step 306 may include identifying defects present in at least one of the one or more additional sets of candidate defects but absent from the set of candidate defects as defects of interest.

In another embodiment, filtering the set of candidate defects to a set of defects of interest includes performing a printability analysis of at least a portion of the reticle using one or more inspection images of the set of inspection images from the one or more filtering reticle inspection tools and filtering the set of candidate defects to a set of defects of interest based on the printability analysis.

A printability analysis may include a prediction of a printed pattern on a sample generated by imaging at least a portion of the reticle onto the sample based on any combination of models or simulations. Further, the predicted patterns may be associated with an exposed sample after lithography and/or a three-dimensional pattern generated by additional process steps such as etching or lift-off. Predictions of one or more process steps are generally described in U.S. Pat. No. 10,496,781 to Fang, issued on Dec. 3, 2019, which is incorporated herein by reference in its entirety.

For example, a printability analysis may include simulations of one or more process steps of a selected process tool (or set of tools) for the fabrication of the structure. In one instance, simulations of process steps may include simulations using conceptual models, heuristics, or the like suitable for generating a three-dimensional model of the structure within a selected specification. By way of another example, a printability analysis may include emulations in which the physical, chemical, electrical, and/or optical interactions of a selected process tool (or set of tools) are replicated to emulate the operation of the selected process tool within a selected specification.

For instance, optical interaction of an illumination beam (e.g., associated with a lithography tool) with a sample may be, but is not required to be, modeled using an electromagnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. A geometric engine is implemented, for example, in AcuShape software provided by KLA-TENCOR. Further, a three-dimensional model of multiple patterning stacks forming a structure based on selected process steps and associated material compositions may be implemented, for example, in PROLITH software provided by KLA-TENCOR.

By way of a further example, a printability analysis may utilize machine learning, neural networks, or the like to predict one or more aspects of a fabricated structure based on a set of training images. For example, a printability analysis may generate the three-dimensional model using deep generative modeling (DGM). Further, the training images may be generated by any method known in the art such as, but not limited to, actual or simulated images of fabricated structures with systematically varying characteristics under systematically varying fabrication conditions.

It is recognized herein that the precise composition and/or properties of some materials may vary depending on the nature of the fabrication and/or the size of pattern elements. For example, the composition and/or properties of thin films may vary based on the deposition method as well as the thermal history of the film (e.g., freshly deposited, annealed, or the like). Accordingly, predicting one or more aspects of the structure based on fabrication of the structure with a selected process tool may include highly accurate representations of fabricated structures.

Referring now generally to Table 1, various non-limiting examples of inspection tools suitable for use in the method 200 are described in accordance with one or more embodiments of the present disclosure.

TABLE 1

| Hot Reticle Inspection Tool | Filtering Reticle Inspection Tool |
|---|---|
| Optical Reticle Inspection Tool | Particle-Beam Reticle Inspection Tool |
| Particle-Beam Reticle Inspection Tool | Optical Reticle Inspection Tool |
| Optical Reticle Inspection Tool | Actinic Reticle Inspection Tool |
| Actinic Reticle Inspection Tool | Optical Reticle Inspection Tool |
| Particle-Beam Reticle Inspection Tool | Actinic Reticle Inspection Tool |
| Actinic Reticle Inspection Tool | Particle-Beam Reticle Inspection Tool |

It is to be understood, however, that the specific examples herein are provided solely for illustrative purposes and should not be interpreted as limiting. For example, although not listed in Table 1, the one or more hot reticle inspection tools may include two or more tools. For instance, the one or more hot reticle inspection tools may include an optical reticle inspection tool and a particle-beam reticle inspection tool, while the one or more filtering reticle inspection tools may include an actinic reticle inspection tool. Similarly, additional combinations of tools are contemplated herein.

Referring now to FIG. 4, FIG. 4 is a flow diagram illustrating steps performed in an inspection method 400 in accordance with one or more embodiments of the present disclosure. Applicant notes that the embodiments and enabling technologies described previously herein in the context of the inspection system 100 should be interpreted to extend to the method 400. It is further noted, however, that the method 400 is not limited to the architecture of the inspection system 100.

In one embodiment, the method 400 includes a step 402 of detecting a set of candidate defects on the reticle based on a set of hot inspection images from one or more hot reticle inspection tools. In another embodiment, the method 400 includes a step 404 of generating an inspection recipe for the one or more filtering patterned-sample inspection tools based on the set of candidate defects. In this way, the one or more filtering patterned-sample inspection tools may generate a set of filtering images based on the inspection recipe. In another embodiment, the method 400 includes a step 406 of filtering the set of candidate defects to a set of defects of interest using the set of filtering images. In another embodiment, the method 400 includes a step 408 of outputting defect data associated with the set of defects of interest. The output data may include any type of data associated with the defects of interest including, but not limited to, a position on the reticle, a defect type or class, or an image of the defect.

In this way the method 400 may be similar to the method 300 with the exception that the filtering inspection tools are patterned-sample inspection tools rather than reticle inspection tools (e.g., as described with respect to the method 200). Accordingly, the descriptions of the steps of the method 300 may be generally applicable to the steps of the method 400 as well. However, it is noted that the step 404 may include generating an inspection recipe for one or more patterned-sample inspection tools to inspect a patterned sample generated by exposing the sample with an image of the reticle (or a portion thereof). Further, the inspection recipe may include directives to inspect an entire patterned-sample (or at least the portions corresponding to inspected portions of the reticle) or the inspection recipe may include directives to inspect only portions of the patterned sample associated with the set of candidate defects on the reticle. As described with respect to the method 300, the inspection recipe may be generated by balancing various factors such as, but not limited to, the size of the sample, the number of candidate defects, the locations of the candidate defects, the throughput of the particular inspection tool, and any penalties for inspecting only selected portions of the sample (e.g., penalties associated with stopping and starting a translation stage near the candidate defects).

As described previously herein, it is contemplated herein that reticle inspection may be improved by a combined analysis of inspection images generated through direct imaging of the reticle itself and of inspection images generated through imaging of a sample exposed by the reticle. In the context of the method 400, it is contemplated herein that inspection images from the patterned-sample inspection tools may naturally provide information suitable for filtering the candidate set of defects from the hot inspection tool based on a measured impact of the candidate defects on the printed pattern on a sample. In particular, candidate defects having little or no impact on printing may be filtered out in the step 406.

In one embodiment, the inspection images from the filtering patterned-sample inspection tool are compared to one or more references to determine the impact of a particular candidate defect on the resulting pattern. Further the references may include any type of reference known in the art including, but not limited to, one or more reference images, design data, design specifications, netlist data, or the like.

It is further contemplated herein that candidate defects that result in at least some measurable deviation of a printed pattern on the sample from a reference may be filtered based on any criteria including, but not limited to, predicted functionality of the fabricated device or predicted reliability of the fabricated device.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A reticle inspection system comprising:
   two or more inspection tools configured to generate two or more sets of inspection images for characterizing a reticle, wherein the two or more inspection tools inspect a common portion of the reticle, wherein the two or more inspection tools include at least one reticle inspection tool providing inspection images of the reticle; and
   a controller communicatively coupled to the two or more inspection tools, the controller including one or more processors configured to execute program instructions causing the one or more processors to:
      correlate data from the two or more sets of inspection images to positions on the reticle;
      detect a set of defects of interest on the reticle with the correlated data as inputs to a multi-input defect detection model, wherein the multi-input defect detection model determines defects for any particular position on the reticle based on analysis of the correlated data associated with the particular position; and
      output defect data associated with the set of defects of interest.

2. The reticle inspection system of claim 1, wherein the at least one reticle inspection tool comprises:
   at least one of an optical reticle inspection tool, a particle-beam reticle inspection tool, or an actinic reticle inspection tool.

3. The reticle inspection system of claim 1, wherein the two or more inspection tools further include at least one printed-sample inspection tool providing inspection images of a sample including patterns generated by exposing the sample with an image of the reticle.

4. The reticle inspection system of claim 3, wherein the at least one printed-sample inspection tool comprises:
   at least one of an optical printed-sample inspection tool, a particle-beam printed-sample inspection tool, or an actinic printed-sample inspection tool.

5. The reticle inspection system of claim 3, wherein correlate data from the two or more sets of inspection images to position on the reticle includes correlate data from inspection images of the sample generated by the printed-sample inspection tool to corresponding positions on the reticle.

6. The reticle inspection system of claim 1, wherein the two or more sets of inspection images are stored on a memory device, wherein the one or more program instructions are further configured to cause the one or more processors to:
   receive the two or more sets of inspection images from the memory device prior to correlating data from the two or more sets of inspection images to positions on the reticle.

7. The reticle inspection system of claim 1, wherein one or more sets of inspection images of the two or more sets of inspection images are stored on a memory device, wherein the one or more program instructions are further configured to cause the one or more processors to:
   receive one or more sets of inspection images of the two or more sets of inspection images during inspection; and
   play back the one or more sets of inspection images from the memory device synchronized to the one or more sets of inspection images received during inspection prior to correlating data from the two or more sets of inspection images to positions on the reticle.

8. The reticle inspection system of claim 1, wherein detect a set of defects of interest on the reticle with the correlated data as inputs to a multi-input defect detection model comprises:
   generate, for each particular location on the reticle, defectivity scores for each of the two or more sets of inspection images; and
   generate, for each particular location on the reticle, an aggregate defectivity score based on aggregating the corresponding defectivity scores for the particular location; and
   identify a set of defects of interest based on the aggregate defectivity scores.

9. The reticle inspection system of claim 8, wherein the defectivity scores for each of the two or more sets of inspection images are weighted based on at least on of predicted functionality, predicted performance, or predicted reliability.

10. The reticle inspection system of claim 1, wherein detect a set of defects of interest on the reticle with the correlated data as inputs to a multi-input defect detection model comprises:

detecting two or more sets of candidate defects based on the two or more sets of inspection images; and identifying a set of defects of interest based on the two or more sets of candidate defects.

11. The reticle inspection system of claim 10, wherein the one or more defects of interest include defects common to a selected number of the two or more sets of candidate defects.

12. The reticle inspection system of claim 1, wherein the two or more inspection tools include an optical reticle inspection tool and a particle-beam reticle inspection tool.

13. The reticle inspection system of claim 1, wherein the two or more inspection tools include an optical reticle inspection tool and an actinic reticle inspection tool.

14. The reticle inspection system of claim 1, wherein the two or more inspection tools include a particle-beam reticle inspection tool and an actinic reticle inspection tool.

15. The reticle inspection system of claim 1, wherein the two or more inspection tools include an optical reticle inspection tool, a particle-beam reticle inspection tool, and an actinic reticle inspection tool.

16. The reticle inspection system of claim 1, wherein the one or more first inspection tools include an optical reticle inspection tool, a particle-beam reticle inspection tool, an actinic reticle inspection tool, and a printed-sample inspection tool.

17. The reticle inspection system of claim 16, wherein the printed-sample inspection tool comprises:

at least one of an optical printed-sample inspection tool, a particle-beam printed-sample inspection tool, or an actinic printed-sample inspection tool.

18. A reticle inspection system comprising:

one or more hot reticle inspection tools configured for hot inspection of a reticle;

one or more filtering reticle inspection tools configured for defect filtering, wherein the one or more filtering reticle inspection tools are different than the one or more hot inspection tools; and a controller communicatively coupled to the one or more hot reticle inspection tools, the controller including one or more processors configured to execute program instructions causing the one or more processors to:

detect a set of candidate defects on the reticle based on one or more sets of hot inspection images from the one or more hot reticle inspection tools;

generate an inspection recipe for the one or more filtering reticle inspection tools based on the set of candidate defects, wherein the one or more filtering reticle inspection tools generate a set of filtering inspection images based on the inspection recipe;

filter the set of candidate defects to a set of defects of interest using the set of filtering inspection images; and output defect data associated with the set of defects of interest.

19. The reticle inspection system of claim 18, wherein the one or more hot reticle inspection tools include at least one of an optical reticle inspection tool, a particle-beam reticle inspection tool, or an actinic reticle inspection tool.

20. The reticle inspection system of claim 18, wherein the one or more filtering reticle inspection tools include at least one of an optical reticle inspection tool, a particle-beam reticle inspection tool, or an actinic reticle inspection tool.

21. The reticle inspection system of claim 18, wherein generate an inspection recipe for the one or more filtering reticle inspection tools based on the set of candidate defects comprises:

direct the one or more filtering tools to inspect a common portion of the reticle inspected by the one or more hot inspection tools, wherein the set of filtering inspection images are associated with portions of the reticle including the set of candidate defects.

22. The reticle inspection system of claim 18, wherein generate an inspection recipe for the one or more filtering reticle inspection tools based on the set of candidate defects comprises:

direct the one or more filtering tools to inspect portions of the reticle including the set of candidate defects, wherein the set of filtering inspection images are associated with the portions of the reticle including the set of candidate defects.

23. The reticle inspection system of claim 18, wherein filter the set of candidate defects to a set of defects of interest using the set of filtering inspection images comprises:

detect one or more additional sets of candidate defects based on the inspection recipe; and identify defects present in the set of candidate defects and a selected number of the one or more additional sets of defects as in the set of defects of interest.

24. The reticle inspection system of claim 23, wherein filter the set of candidate defects to a set of defects of interest using a set of inspection images from the one or more filtering reticle inspection tools further comprises:

identify a set of defects present in at least one of the one or more additional sets of candidate defects but absent from the set of candidate defects as defects of interest.

25. The reticle inspection system of claim 18, wherein filter the set of candidate defects to a set of defects of interest using the set of filtering inspection images comprises:

perform a printability analysis of at least a portion of the reticle using one or more inspection images of the set of filtering inspection images; and filter the set of candidate defects to a set of defects of interest based on the printability analysis.

26. The reticle inspection system of claim 25, wherein perform a printability analysis of at least a portion of the reticle using one or more inspection images of the set of filtering inspection images comprises:

predict a printed pattern on a sample associated with imaging at least a portion of the reticle onto the sample; and filter the set of candidate defects to a set of defects of interest based on the predicted printed pattern.

27. The reticle inspection system of claim 26, wherein predict a printed pattern on a sample associated with imaging at least a portion of the reticle onto the sample comprises:

at least one of model or simulate a printed pattern on a sample associated with imaging at least a portion of the reticle onto the sample.

28. The reticle inspection system of claim 18, wherein the one or more hot reticle inspection tools include an optical inspection tool, wherein the one or more filtering reticle inspection tools include a particle-beam inspection tool.

29. The reticle inspection system of claim 18, wherein the one or more hot reticle inspection tools include a particle-beam inspection tool, wherein the one or more filtering reticle inspection tools include an optical inspection tool.

30. The reticle inspection system of claim 18, wherein the one or more hot reticle inspection tools include an optical inspection tool, wherein the one or more filtering reticle inspection tools include an actinic inspection tool.

31. The reticle inspection system of claim 18, wherein the one or more hot reticle inspection tools include an actinic inspection tool, wherein the one or more filtering reticle inspection tools include an optical inspection tool.

32. The reticle inspection system of claim 18, wherein the one or more hot reticle inspection tools include a particle-beam inspection tool, wherein the one or more filtering reticle inspection tool includes an actinic inspection tool.

33. The reticle inspection system of claim 18, wherein the one or more hot reticle inspection tools include an actinic inspection tool, wherein the one or more filtering reticle inspection tools include a particle-beam inspection tool.

34. The reticle inspection system of claim 18, wherein the one or more hot reticle inspection tools include an optical inspection tool and a particle-beam inspection tool, wherein the one or more filtering reticle inspection tools include an actinic inspection tool.

35. The reticle inspection system of claim 18, wherein the one or more hot reticle inspection tools include an optical inspection tool and an actinic inspection tool, wherein the one or more filtering reticle inspection tools include a particle-beam inspection tool.

36. A reticle inspection system comprising:
   one or more hot reticle inspection tools configured for hot inspection of a reticle;
   one or more filtering patterned-sample inspection tools configured for inspection of a sample including patterns generated by exposing the sample with an image of the reticle; and
   a controller communicatively coupled to the one or more hot reticle inspection tools, the controller including one or more processors configured to execute program instructions causing the one or more processors to:
      detect a set of candidate defects on the reticle based on a set of hot inspection images from the one or more hot reticle inspection tools;
      generate an inspection recipe for the one or more filtering patterned-sample inspection tools based on the set of candidate defects, wherein the one or more filtering reticle inspection tools generate a set of filtering inspection images based on the inspection recipe;
      filter the set of candidate defects to a set of defects of interest using the set of filtering inspection images; and
      output defect data associated with the defects of interest.

37. The reticle inspection system of claim 36, wherein the one or more hot reticle inspection tools include at least one of an optical reticle inspection tool, a particle-beam reticle inspection tool, or an actinic reticle inspection tool.

38. The reticle inspection system of claim 36, wherein the one or more patterned-sample inspection tools include at least one of an optical patterned-sample inspection tool, a particle-beam patterned-sample inspection tool, or a patterned-sample actinic inspection tool.

39. The reticle inspection system of claim 36, wherein generate an inspection recipe for the one or more filtering reticle inspection tools based on the set of candidate defects comprises:
   direct the one or more filtering tools to inspect portions of the sample including patterns generated by portions of the reticle inspected by the one or more hot inspection tools, wherein the set of filtering inspection images are associated with portions of the sample corresponding to the set of candidate defects on the reticle.

40. The reticle inspection system of claim 36, wherein generate an inspection recipe for the one or more filtering reticle inspection tools based on the set of candidate defects comprises:
   direct the one or more filtering tools to inspect portions of the sample associated with the set of candidate defects on the reticle, wherein the set of filtering inspection images are associated with the portions of the reticle including the set of candidate defects on the reticle.

41. The reticle inspection system of claim 36, wherein filter the set of candidate defects to a set of defects of interest using a set of inspection images from the one or more patterned-sample inspection tools comprises:
   detect one or more additional sets of candidate defects on the sample;
   correlating the one or more additional sets of candidate defects to defect positions on the reticle; and
   identify defects present in the set of candidate defects and a selected number of the one or more additional sets of candidate defects as defects of interest.

42. The reticle inspection system of claim 41, wherein filter the set of candidate defects to a set of defects of interest using a set of inspection images from the one or more patterned-sample inspection tools further comprises:
   identifying one or more defects present in at least one of the one or more additional sets of candidate defects but absent from the set of candidate defects as defects of interest.

43. The reticle inspection system of claim 41, wherein the one or more hot reticle inspection tools include an optical reticle inspection tool, wherein the one or more filtering patterned-sample inspection tools include at least one of an optical patterned-sample inspection tool, a particle-beam patterned-sample inspection tool, or an actinic patterned-sample inspection tool.

44. The reticle inspection system of claim 41, wherein the one or more hot reticle inspection tools include a particle-beam reticle inspection tool, wherein the one or more filtering patterned-sample inspection tools include at least one of an optical patterned-sample inspection tool, a particle-beam patterned-sample inspection tool, or an actinic patterned-sample inspection tool.

45. The reticle inspection system of claim 41, wherein the one or more hot reticle inspection tools include an actinic reticle inspection tool, wherein the one or more filtering patterned-sample inspection tools include at least one of an optical patterned-sample inspection tool, a particle-beam patterned-sample inspection tool, or an actinic patterned-sample inspection tool.

* * * * *